United States Patent [19]

Shah

[11] Patent Number: 4,496,222

[45] Date of Patent: Jan. 29, 1985

[54] APPARATUS AND METHOD FOR PHOTOLITHOGRAPHY WITH PHASE CONJUGATE OPTICS

[75] Inventor: Rajiv R. Shah, Plano, Tex.

[73] Assignee: Texas Instruments Incorporated, Dallas, Tex.

[21] Appl. No.: 605,984

[22] Filed: May 1, 1984

Related U.S. Application Data

[63] Continuation of Ser. No. 332,384, Dec. 21, 1981, abandoned.

[51] Int. Cl.$^3$ .................................................. G02F 1/35
[52] U.S. Cl. ................................... 350/354; 350/3.62; 350/393
[58] Field of Search ...................... 350/3.62, 354, 393, 350/379; 355/77; 307/425

[56] References Cited

U.S. PATENT DOCUMENTS 3,572,925   3/1971   Ables et al. ............................ 355/46
3,584,221   6/1971   Motoaki ................................. 350/393

OTHER PUBLICATIONS

Moses et al., "Amplification & Phase Conjugation by Degenerate Four-Wave Mixing in a Saturable Absorber", Optics Lett., 2-1980, pp. 64-66.
White et al., "Real-Time Processing Via Four-Wave Mixing in a Photorefractive Medium", App. Phys. Lett., 7-1980, pp. 5-7.
Levenson, M. D., "High Resolution Imaging by Wave-Front Conjugation", Optics Lett., 5-1980, p. 182.
Hellwarth, R. W., "Generation of Time-Reversed Wave Fronts by Nonlinear Refraction", Jr. Opt. Soc. Am., 1-1977, pp. 1-3.
Bloom et al., "Conjugate Wave-Front Generation & Image Reconstruction by Four-Wave Mixing", App. Phys. Lett., 11-1977, pp. 592-594.
Yariv et al., "Amplified Reflection, Phase Conjugation & Oscillation in Degenerate Four-Wave Mixing", Optics Lett., 7-1977, pp. 16-18.
Yariv, A., "Phase Conjugte Optics & Real-Time Holography", IEEE Jr. of Q.E., 1978, pp. 650-660.
Levenson et al., "Projection Photolithography By Wave-Front Conjugation", Jr. Opt. Soc. Am., 6-1981, pp. 737-743.

*Primary Examiner*—William H. Punter
*Attorney, Agent, or Firm*—Thomas W. Demond; N. Rhys Merrett; Melvin Sharp

[57] ABSTRACT

An apparatus and method of photolithography with phase conjugate optics having a pump nonlinear medium for producing four way mixing of a beam of coherent electromagnetic radiation incident to said nonlinear medium with a spatially modulated representation of image thereon. The nonlinear medium producing by the phenomenon of four way mixing. A phase conjugated beam having a representation of the image spatically amplitude modulated thereon. The phase conjugated beam is directed toward a surface sensitive to electromagnetic radiation.

4 Claims, 6 Drawing Figures

Fig.1

APPARATUS AND METHOD FOR PHOTOLITHOGRAPHY WITH PHASE CONJUGATE OPTICS

This application is a continuation of application Ser. No. 332,384, filed Dec. 21, 1981, and now abandoned.

BACKGROUND OF THE INVENTION

1. Field of the Invention

This invention relates to photolithography of substrates, and more particularly, the invention relates to photolithography with phase conjugate optics for imaging onto a substrate.

2. Description of the Prior Art

With the evolution of microelectronic devices continuing, the desire to form individual structures of smaller and smaller dimensions with more and more complexity has created a demand for extremely fine line lithography. Projection photolithography is currently replacing proximity printing as a means for reproducing images with the finest achievable resolution. With the step and repeat type systems currently available, the optics utilized within the projection photolithography machines has approached the ultimate performance level for apparatus of this type. The optical systems involved in photolithography with projection printing consists of refractive and reflective elements. These systems do not reach diffraction limited performance. The semiconductor manufacturing industry requirements are for a production capability with line widths within the submicron range. Electron beam and x-ray lithography techniques are being developed in order to meet the demand for submicron structures.

A photolithographic system utilizing a step and repeat technique is shown in U.S. Pat. No. 3,572,925, issued to Ables on Mar. 30, 1971, and entitled "Step and Repeat Camera with Computer Controlled Film Table". Although Ables shows photolithographic printing and the reproduction of images on a glass substrate, a semiconductor wafer can be substituted therefor. Further, the Ables patent shows a plurality of optical paths, although a single optical path is generally utilized by the machines currently available. The image which is present on a reticle or mask is reproduced onto the glass substrate with a electromagnetic radiation sensitive layer thereon. The photosensitive layer has portions thereof exposed by light which passes first through the reticle and finally impinges onto the electromagnetic radiation sensitive layer on the photographic plate. The X-Y table which supports the photographic plate is then repositioned and the process of exposing another image is continued. The positioning of the X-Y table is accomplished by the utilization of laser interferometers along with a computer to provide positional information for controlling motors which are connected and controlled by the computer. The computer maintains a positional record of the X-Y table by counting fringe lines which are detected by the laser interferometer. The currently available direct step-on-wafer machines are capable of reproducing the image taken from a reticle or mask and reproducing it onto the wafer through an optical path. However, as discussed above, these systems are limited by the optics utilized and are capable of reproducing geometeries regularly which have the dimension of greater than a few microns.

A phenomenon resulting from nonlinear optical mixing is called "phase conjugation". It is a phenomenon which results from the use of nonlinear techniques for real time processing of electromagnetic fields. Phase conjugation is a term which is utilized to describe a phenomenon involving reversal of direction of propagation and in addition a phase reversal of an incident beam of electromagnetic radiation. In one form of phase conjugation, known as degenerate four wave mixing, the incident incoming beam is mixed with a pair of pump beams, as will be discussed herein, and a fourth output beam is generated within the nonlinear medium which is the phase conjugate of the incoming or incident beam. The properties of the conjugated beam are such that as the wave propagates the phase of the conjugated beam undergoes a time reversal with respect to the phase properties of the incoming or incident beam. It has been further noted that the incoming beam can be amplified by the pump beams within the linear medium to produce a conjugated beam which has a greater intensity or amplitude than the incoming or incident beam. As the conjugated beam propagates away from the nonlinear medium, its phase condition is substantially identical with the phase condition of the incoming beam at the same distance from the nonlinear medium along their respective optical paths. In other words, if the incoming beam of electromagnetic radiation has a particular phase condition at time T1 and the waves in the beam require a time interval $\Delta T$ to reach the nonlinear medium at time T2, the conjugate beam has the identical particular phase condition of the incoming beam at T1 as it progagates away from the nonlinear medium along its optical path at a time equal to the time of exit of wave of electromagnetic radiation from the nonlinear medium at time T3 plus the time interval $\Delta T$. This phenomenon has been described as time reversal in that the phase component of the electromagnetic radiation of the conjugate beam has experienced a reversal of its time variable. The phenomena associated with phase conjugation are described in more detail in the papers by Yariv and Pepper, published in Optics Letters Vol. 1, No. 1, in July 1977, and entitled "Amplified Reflection, Phase Conjugation, and Isolation in Degenerative Four Wave Mixing", and Yariv published in the IEEE Journal of Quantum Electronics, Vol. QE-14, No. 9, on September 1978 and entitled "Phase Conjugate Optics and Real Time Holography, which are incorporated by reference hereinto.

The phase conjugation phenomenon can also be utilized within a photolithographic system to reduce the speckle. Speckle is a term used to describe a phenomenon in which the scattering of light from a highly coherent source, such as a laser, by a rough surface, or in inhogenous medium generates a random intensity distribution of light that gives the surface or medium a granular appearance.

In photolithography, even the mild speckle which results from the incidence of the electromagnetic radiation wth the mask irradiated can cause defects in the reproductions of the images present on the mask.

SUMMARY OF THE INVENTION

The invention has a nonlinear optical medium into which pump beams of the same frequency but opposite in direction are incident. The pump beams are produced by a source of coherent electromagnetic radiation, for example, a laser. The laser has its output beam passed through a beam expander to produce a coherent beam of electromagnetic energy, but with a larger cross sectional area than the original beam produced by the laser.

The coherent beam from the beam expander is passed through a beam splitter which produces a pump beam and an imaging beam along separate optical paths. The imaging beam is passed incident to a mask or reticle, which has a representation of the image which is desired to produce, located thereon. The beam of electromagnetic energy which continues on from the mask has a representation of the image spacially reproduced thereon across the width of the beam. This image beam is then directed into the nonlinear medium.

The pump beam from the beam splitter is also directed into the nonlinear medium and therethrough. After passing through the nonlinear medium, the pump beam is reflected by a conventional mirror back into the nonlinear medium. This forms a pump wave within the nonlinear medium which, when mixed with the image beam incident to the nonlinear medium, generates a phase conjugated beam which is directed out of the nonlinear medium along the same optical path as the incoming imaged beam. The phase conjugated beam is separated from the image beam and is directed along a separate optical path toward a surface (on a target object) which is sensitive to electromagnetic radiation for production of the image thereon. The phase conjugated beam produced by the nonlinear medium has a greater amplitude than the imaged beam which is incident to the nonlinear medium. The nonlinear medium and the pump wave generated therein can be regarded as amplifying the incoming wave and inverting its phase component such that the phase component undergoes a time reversal which results in the conjugated beam reproducing the phase components of the imaged beam at locations along its optical path. The spatial amplitude modulation, which was placed upon the imaging beam to form the imaged beam, is present on the phase conjugated beam. However, various distortions and diffraction effects which have occurred are removed as the phase conjugated beam propagates along its optical path. The phases of the imaging beam which, after incidence with the mask, becomes the imaged beam and the conjugated beam are identical along the respective optical path which have the same time intervals for waves of electromagnetic radiation to pass from that location to the nonlinear medium.

In certain instances, it is desirable to provide a converging means which is incident with the pump beam from the beam splitter to project a converging beam into the nonlinear medium. The converging beam which exits the nonlinear medium is incident to a diverging optical apparatus which projects a beam coincident and collinear with the converging means into the nonlinear medium. The radius of curvature of the mirrors and the distance between them are chosen appropriately. When the imaged beam is directed into the nonlinear medium, the conjugated beam which results therefrom is converging as it propagates away from the nonlinear medium. Thus, the image produced on the surface which is sensitive to the electromagnetic radiation is reduced from the representation of the image present on the mask. This reduction technique allows the utilization of masks or reticles with images of, for example, ten times larger than the image which is finally produced on the substrate with its surface sensitive to electromagnetic radiation.

It is an advantage of the present invention to provide a photolithographic imaging system having an increased resolution approaching theoretical limits.

It is another advantage of the present invention to provide an image system which is free from speckle effects.

An additional advantage of the present invention is to provide a photolithographic imaging system having finer line widths.

It is also an advantage of the present invention to provide a photolithographic imaging system which corrects defects by passing the conjugated imaged beam back through the mask to remove certain diffusion and distortion effects which occurred during the initial passage of the image beam through the mask.

Another advantage of the present invention is to provide an optical imaging system which utilizes a nonlinear medium which has a pump wave generated therein to produce a phase conjugated beam as an output when an imaged beam is directed thereinto.

It is an advantage of the present invention to provide an optical imaging system which provides a phase conjugated imaged beam which is converging to produce an image on an electromagnetic radiation sensitive surface which is reduced from the size of the original image present on the mask.

Another advantage is not requiring complicated, computer designed and finely ground multielement refractive imaging line, which reduces costs.

An additional advantage of the present invention is to provide an optical imaging system which has an X-Y positioning table, laser interferometers for positioning purposes, a laser for providing electromagnetic radiation in a coherent beam, a nonlinear medium for generating a pumped wave therein, a mask having the representation of an image thereon, and a surface which is sensitive to electromagnetic radiation.

BRIEF DESCRIPTION OF THE DRAWINGS

FIG. 1 is a partly electrical, partly optical, partly mechanical schematic of an optical imaging system constructed according to the present invention;

DESCRIPTION OF THE PREFERRED EMBODIMENT

Figure 1:
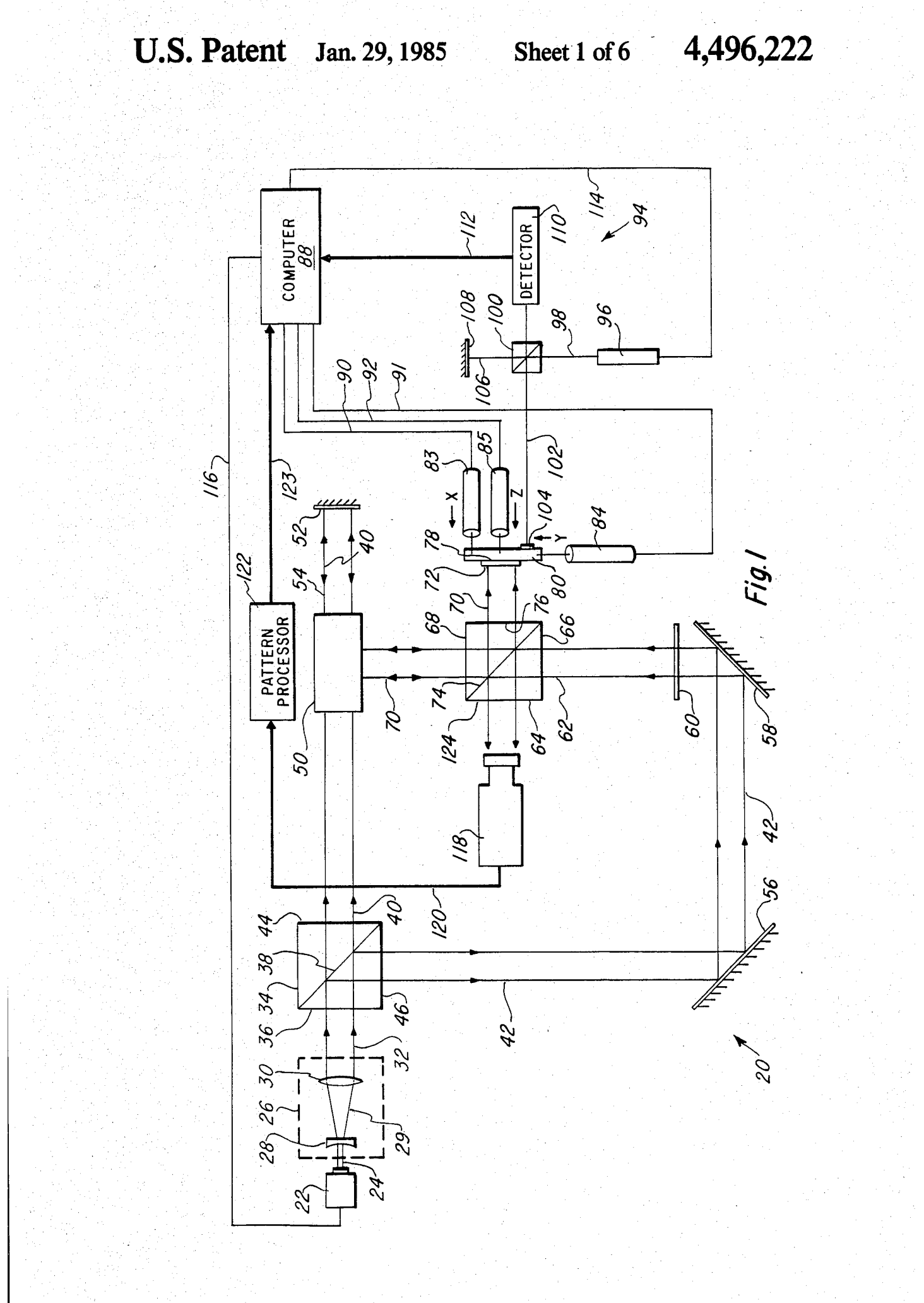
Figure 2:
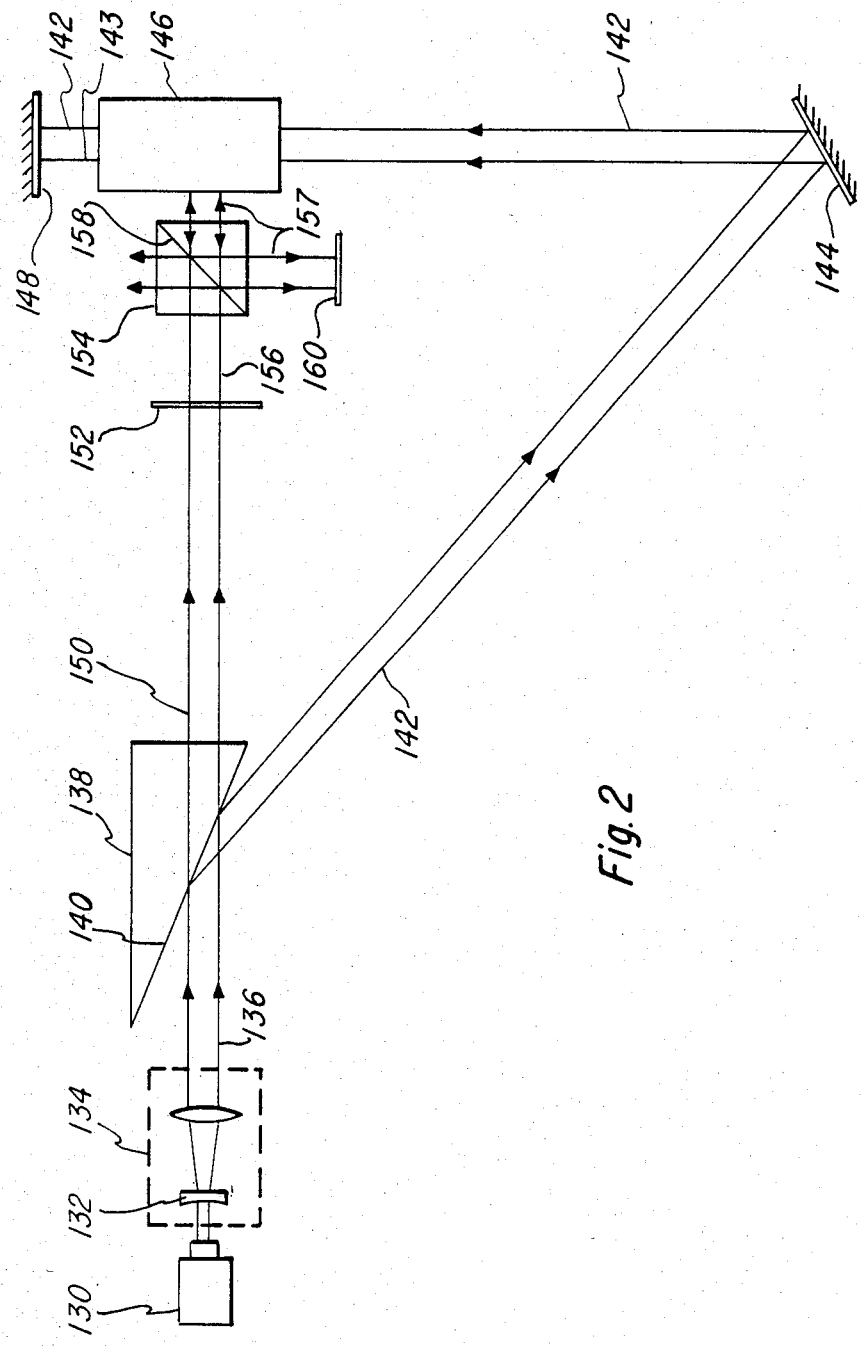
FIG. 2 is an optical apparatus which can be utilized with the present invention.

With reference to the drawings and in particular to FIG. 1 thereof, an imaging system 20 is shown. The imaging system 20 has a laser 22 which produces a beam of coherent electromagnetic radiation 24. Beam 24 is incident to a beam expander 26. Beam expander 26 includes a lens 28 which produces a diverging beam 29 which in turn is incident on lens 30. Beam 29 is diverging and after incidence to lens 30, it is collimated into a beam 32. The rays of electromagnetic radiation within beam 32 are parallel. Thus, beam expander 26 increases the cross sectional area of beam 24 to the larger cross sectional area of beam 32. Beam 32 is incident to a beam splitter 34. Beam 32 enters beam splitter 34 through a side 36 thereof. The optical path of beam 32 adjacent side 36 is perpendicular thereto. Thus, the rays of electromagnetic radiation within beam 32, which are parallel, are perpendicular to the side 36. Beam 32 penetrates side 36 and passes through beam splitter 34 until it reaches the internal mirrored surface 38 thereof. Surface 38 passes most of the electromagnetic radiation within beam 32 to form a power beam 40. The portion of the electromagnetic radiation reflected by partially reflecting surface 38 forms an imaging beam 42. As shown in FIG. 1, the partially reflecting surface 38 is at an angle of approximately 45° to the path of the beam 42. The path of beam 42, which is reflected by surface 38, is at an angle of approximately 45° thereto. Thus, beam 42 has an optical path adjacent surface 38 which is at right angles to the path of beams 32 and 40. Beams 40 and 42 pass perpendicularly through sides 44 and 46, respectively, of beam splitter 34. Beam 40 continues along its optical path and is incident to and passes through a nonlinear medium 50. The nonlinear optical medium 50 can be gas, liquid, or solid, for example, CS2, Na vapor, ruby, LINb03, or any other nonlinear optical medium as known in the art. After passing through the nonlinear medium 50 beam 40 is incident to a mirror 52 and has its optical path perpendicular to the flat surface of mirror 52. The beam 54 reflected from mirror 52 is collinear with beam 40. Beam 54, along with beam 40 within nonlinear medium 50, form the pump wave within the nonlinear medium which is necessary for four wave mixing, which produces the phase conjugation as discussed above.

Imaging beam 42 is incident at an angle of 45° to mirror 56, which reflects beam 42 at an angle of 45° toward another mirror 58. Mirror 58 is incident to beam 42 at an angle approximately 45° and reflects beam 42 therefrom at an angle of approximately 45°. The sections of the beam 42 reflected from surface 38 and mirror 58 are parallel, but propagating in opposite directions, as shown in FIG. 1. The portions of beam 42 between surface 38 and mirror 56, between 56 and 58, and between mirror 58 and mask 60, comprise a single optical path as described herein for the imaging beam 42. Other mirrors, reflecting surfaces, various lenses, and other optical apparatus can be present within this optical path, or for that matter, the optical path of beam 40.

After reflection of beam 42 from mirror 58, the beam is incident to a mask 60. Mask 60 has a representation of an image, which is desired to reproduce, present thereon. This image can be, for example, that utilized for current photolithographic techniques wherein portions of the mask are transparent and the other portions are opaque. It is also possible within the current invention to have a mask incident with the beam 42 and a portion of the surface being mirrored for reflecting a portion of beam 42 and the remaining portions absorbing or transparent for passing a portion of the electromagnetic radiation therethrough. The beam 42 reflected from the mirrored portion surface of the mask would then form the imaged beam which would then be incident to the nonlinear medium 50.

The imaged beam 62, which has been spatially amplitude modulated by the representation of the desired image on mask 60, passes through beam splitter 64 and proceeds along the same optical path into nonlinear medium path 50. The imaged beam 62 has also been phase modulated due to the difference in refractive index or the velocity of the light between the transmitting portion of the mask 60 and a vacuum.

Beam 62 enters beam splitter 64 through side 66 thereof and exits through side 68. Sides 66 and 68 are parallel and the path of beam 62 is perpendicular to the sides 66 and 68. The beam 62, passing into nonlinear medium 50, has approximately the same wavelength as beams 40 and 54 which form the pump wave within nonlinear medium 50. The four wave mixing taking place results in the formation of a phase conjugated wave which passes out of the nonlinear medium 50 as a phase conjugated beam 70. Phase conjugated beam 70 is between nonlinear medium 50 and beam splitter 68 collinear with image beams 62.

The phase conjugated beam 70 is directed toward the electromagnetic radiation sensitive surface 72 by the mirrored surface 74 located within beam splitter 64. The mirrored surface 74 redirects the optical path of the phase 70 from the nonlinear medium 50° at 90° toward the surface 72. The phase conjugated beam enters through side 68 and exits through side 76 of beam splitter 64. Surface 72 is located on a substrate (or target object) 78 which can be any material, for example, a semiconductor wafer. Substrate 78 is moveable by an X-Y table 80. Substrate 78 can be affixed to X-Y table 80 or held thereon by the forces of gravity. X-Y table 80 is capable of movement of the substrate 78 in a plane perpendicular to the optical path of phase conjugated beam 70 adjacent surface 72. Of course, in the alternative, the optical system could be moved and table 80 remains stationary in order to accomplish the relative movement between the optical system and the surface 72. Table 80 can move substrate 78 to position it for repeated exposures as performed in the direct step-on wafer apparatus currently available. Alternatively, the mask 60 and the substrate 72 can be placed in relative simultaneous motion with respect to the optical paths therebetween to accomplish projection type printing as known in the art. In addition, the X-Y table 80 can also be adapted to be driven along the optical path of conjugated beam 70 adjacent surface 72. Thus, focusing can also be accomplished by utilizing the X-Y table 80.

The movement of X-Y table 80 is accomplished by motors 83 through 85. Motor 83 is connected to X-Y table 80 to drive it in the X direction with motor 84 connected to drive the X-Y table in the Y direction. The control signals for accomplishing the X, Y and Z motions of table 80 are provided by computer 88 to motors 83-85 through lines 90-92, respectively.

The movement of the table is sensed by laser interferometers (only laser interferometer for the Z axis is shown in FIG. 1). All the various components including mirrors, beam splitters, the nonlinear medium, the beam expander, and the lasers could all be adjusted spatically via detection of their movements and position by a laser interferometer. The adjustments can be provided by computer 88. This also applies to relative movements of the mask 60 and substrate 78 disposed on table 80. The use of such laser interferometers is shown in U.S. Pat. No. 3,572,925, issued to Ables on Mar. 30, 1971, and entitled "Step and Repeat Camera with Computer Controlled Film Table", which is incorporated by reference hereinto.

Laser interferometer 94 includes a laser 96 which directs a coherent light beam 98 into a beam splitter 100. Beam splitter 100 separates beam 98 into a beam 102 directed toward a mirror 104 on the underside of table 80 and a beam 106 directed toward mirror 108 which is affixed to the support structure which is holding the various components of the imaging system 20 in their relative proper spatical relationship. Mirrors 104 and 108 direct the light present in beams 102 and 106, respectively, back into beam splitter 100 which directs a portion of the beam 102 reflected from mirror 104 through the beam splitter into a detector 110 and a portion of beam 106 reflected from mirror 108 into detector 110. Detector 110 is capable of detecting amplitude variations caused by the fringe lines formed from the alternate reinforcement and interference of the coherent light reflected from mirrors 104 and 108. The output of detector 110, which comprises translational information signals indicating amount and direction of movement, is connected through channel 112 to computer 88.

Laser 96 is actuated by computer 88 through a line 114. Further, computer 88 also actuates laser 22 through line 116. Imaging system 20 can be provided with an optical recognition device 118 which can be, for example, a TV camera. The output of the optical recognition device is connection through multiline channel 120 to a pattern recognition processor 122. The device 118 is positioned to view the surface 72 relative to the optical path of phase conjugated beam 70 adjacent thereto. Processor 122 is capable of recognizing patterns on the surface 72 and generating positional error signals on channel 123. This can be accomplished, for example, by positioning the device 118 to view the surface 72 through beam splitter 74 through side 76 and side 124, which is opposite and parallel to side 76.

In operation, computer 88 can issue the necessary control signals in response to the information obtained from pattern processor 122 through multiline channel 123 to properly position the table 80. The ultimate goal, of course, is to have the surface 72 properly positioned incident to the phase conjugated beam 70. Exact positioning of the table 80 is obtained through the various laser interferometers (only laser interferometer 94 along the Z axis is shown) utilized to obtain positional information to insure proper focusing and positioning of the surface 72 relative to phase conjugated beam 70.

In FIG. 2, a laser 130 directs a beam 132 of coherent electromagnetic energy into a beam expander 134. Expander 134 enlarges the area of beam 132 and collimates the expanded beam to form beam 136 as its output. Beam 136 is incident to a prism 138 at a partially reflecting surface 140. The optical path of beam 136 from beam expander 134 to prism 138 has an acute angle with respect to surface 140. Most of the electromagnetic energy is reflected by surface 140 to form a power beam 142. Beam 142 continues along its optical path and is reflected by a mirror 144 into nonlinear medium 146. Beam 142 passes through nonlinear medium 146 and is reflected by mirror 148 back into nonlinear medium 146 with the reflected beam 143 collinear with beam 142. The reflected beam 143 and beam 142 form the pump wave as discussed above within nonlinear medium 146. The portion of beam 136 not reflected by surface 140 passes through prism 138 and forms an imaging beam 150. Imaging beam 150 passes through mask 52 and beam splitter 154 into nonlinear medium 146. Mask 152 has a representation of the image it is desired to reproduce located thereon which becomes spatically amplitude modulated onto beam 150. This produces imaged beam 156. It is this imaged beam 156 that actually passes through beam splitter 154 and enters into nonlinear medium 146. The phase conjugated beam 157 generated by nonlinear medium 146 passes into beam splitter 154 and is reflected by surface 158 thereof to be incident with the electromagnetic radiation sensitive surface 160.

FIGS. 2-6 represents various optical apparatuses which can be utilized with the present invention. The optical apparatus could have the features as the image system 20 adapted thereto, for example, table 80, computer 88, etc.

Figure 3:
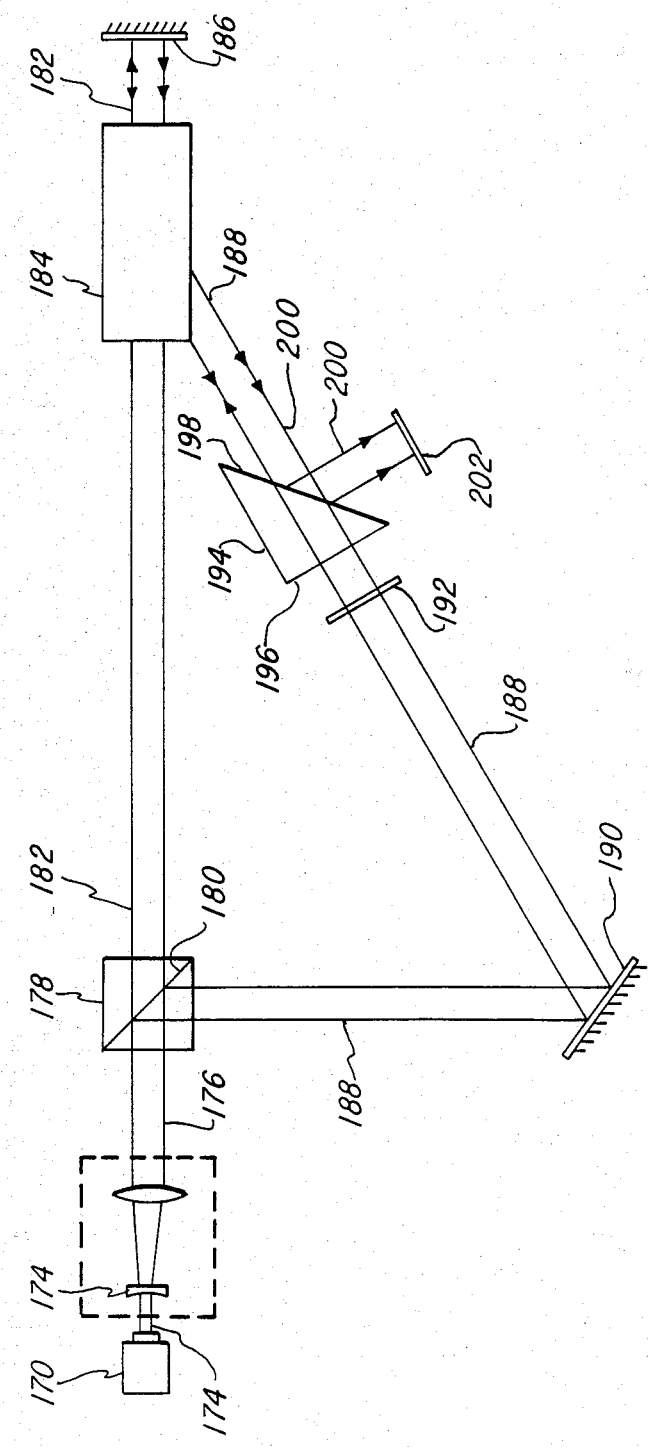
FIG. 3 is another embodiment of an optical apparatus which can be utilized with the present invention.

As shown in FIG. 3, a laser 170 directs a beam 172 of coherent electromagnetic radiation into a beam expander 174 which enlarges the cross sectional area of beam 172 to form a beam 176. Beam expander 174 also provides that beam 176 is collimated and is not diverging or converging. Beam 176 is incident to a beam splitter 178, which passes the majority of the electromagnetic radiation in beam 176 through its partially reflecting surface 180. The electromagnetic radiation passing through surface 180 forms a power beam 182 which is directed into the nonlinear medium 184. Beam 182 passes through nonlinear medium 184 and is reflected back into the nonlinear medium by mirror 186. The reflected beam and power beam 182 for the pump wave within nonlinear medium 184 as discussed above.

The portion of beam 176 reflected by surface 180 forms an imaging beam 188. Imaging beam 188 is directed into nonlinear medium 84 along an optical path which has an acute angle with respect to the optical path of beam 182 from beam splitter 178 through nonlinear medium 184. This allows for an increased overlap of the two beams in the nonlinear medium and, therefore, an improved utilization of the nonllinearity of the medium. Between mirror 190 and nonlinear medium 184, beam 188 passes through mask 192 (creating an imaged beam) and prism 194. Beam 188 passes through side 196 and exits prism 194 through side 198. The optical path of beam 188 adjacent side 196 is perpendicular to the plane thereof. The plane in which side 198 lies is at an angle of approximately 45° with respect to the optical path of beam 188 adjacent thereto. Prism 194 is adapted to pass the electromagnetic radiation within beam 188 through sides 196 and 198. The reflected phase conjugated beam 200 is reflected by side 198 and directed onto the electromagnetic radiation sensitive surface 202.

Figure 4:
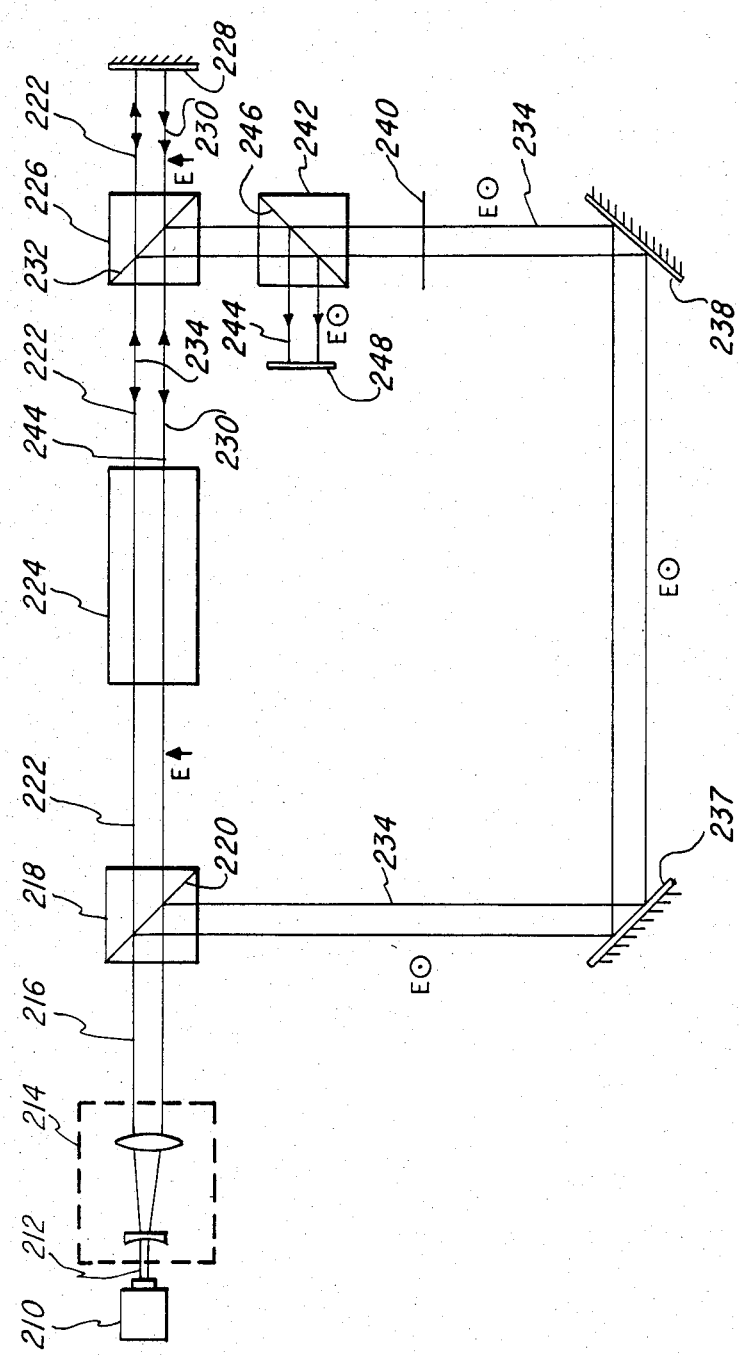
FIG. 4 is schematic of an optical apparatus which allows the entire volume of the pumped wave within the nonlinear medium to be utilized for producing a phase conjugated beam.

As shown in FIG. 4, a laser 210 produces a beam 212 of coherent electromagnetic radiation which is directed into a beam expander 214. Beam expander 214 produces a beam of coherent electromagnetic radiation 216. Beam 216 is neither converging or diverging and propagates as a parallel beam. Beam 216 is directed from beam expander 214 into beam splitter 218. Beam splitter 218 has a partially reflecting surface 220 which allows the majority of the electromagnetic radiation in beam 216 to pass therethrough to form a power beam 222. Power beam 222 is directed from beam splitter 218 into a nonlinear medium 224. Beam 222 passes through nonlinear medium 224 and through a beam splitter 226 and is reflected by a mirror 228 to form a reflected beam 230. The reflected beam 230 passes through beam splitter 226 into nonlinear medium 224 collinear with beam 222. Beams 222 and 230 form the pump wave within the nonlinear medium 224 as discussed above. A partially reflected surface 232 is located within beam splitter 226. Surfaces 220 and 232 are polarized and allow beams 222 to pass therethrough but not the portion of the electromagnetic energy reflected by surface 220. Beam splitter 218 reflects, for example, the perpendicular components of the beam 216 and transmits the parallel components to form beam 22. The parallel component passes through nonlinear medium 224 and beam splitter 226 toward mirror 228. The perpendicular component is reflected by surface 232 into nonlinear medium 224, collinear with beam 222 and 230.

Since the two pumps beams and the image beam are collinear within the nonlinear medium, the efficiency of the generation of the phase conjugated beam is increased. In other words, the intensity of the phase conjugated beam is greater for a given nonlinear medium and given intensity of the power beams.

The electromagnetic radiation reflected by surface 220 from beam 216 forms an imaging beam 234. Imaging beam 234 is reflected by mirrors 237 and 238 along its optical path at angles of 45° for both mirrors such that the portion of the beam 234 incident of mirror 237 is parallel but opposite in direction to the path of the beam 234 reflected from mirror 338. After reflection from mirror 238, beam 234 passes through mask 240 (creating an imaged beam) and beam splitter 242 and enters into beam splitter 226. The surface 232 of beam splitter 226 reflects beam 234 along its optical path into nonlinear medium 224 coincident with beams 222 and 230. The phase conjugated beam 244 is generated within nonlinear medium 224 and is directed outward therefrom along the optical path coincident with beams 222, 230 and 234 and is reflected by the partially reflecting surfaces 232 of beam splitter 226 toward beam splitter 242. Reflecting surface 246 reflects the beam 244 along an optical path toward electromagnetic radiation sensitive surface 248. Surfaces 232 and 246 are at 45° with respect to the optical paths of the beams incident thereto and reflected therefrom.

Figure 5:
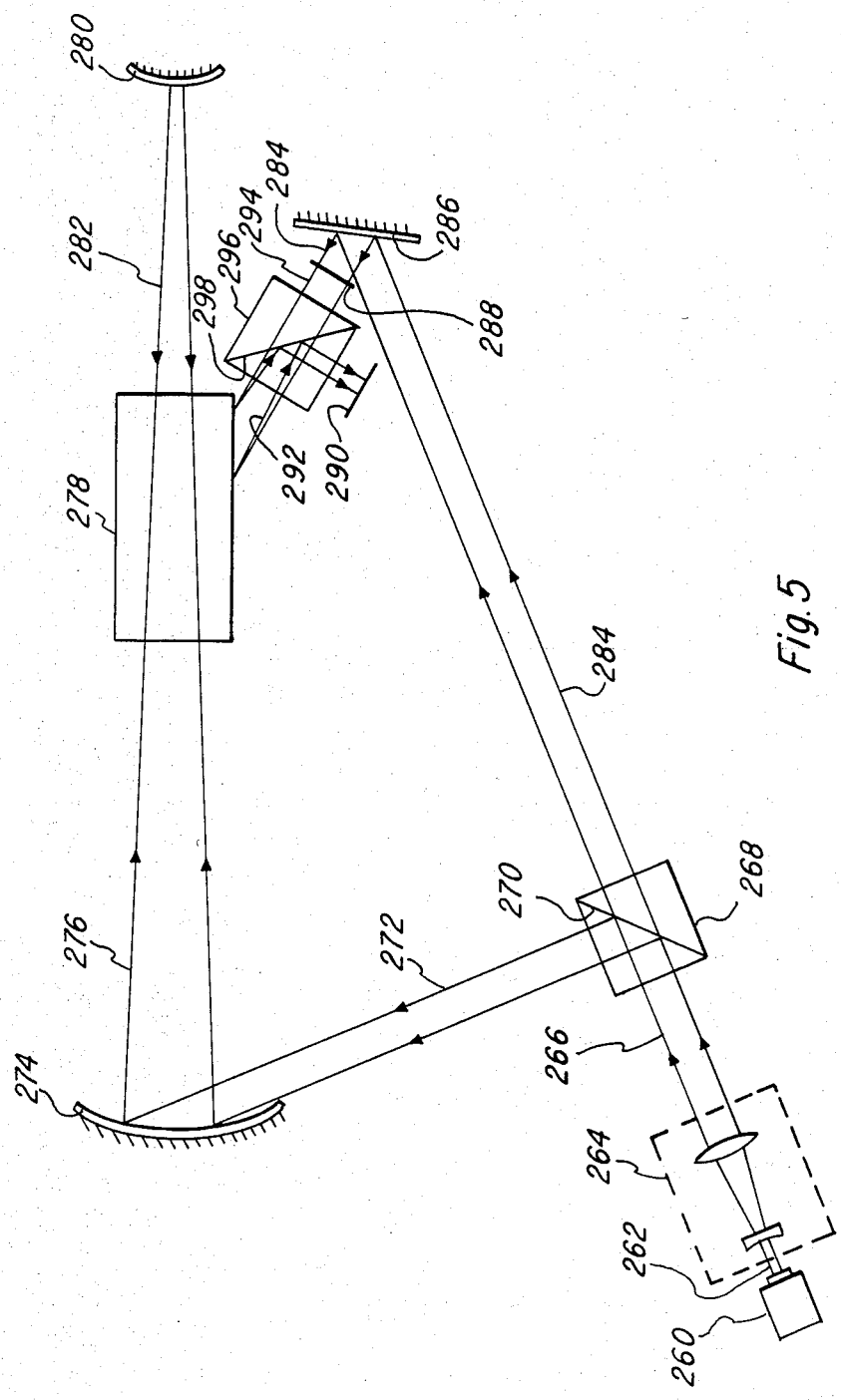
FIG. 5 is an optical apparatus which allows the production of a reduced image utilizing a converging phase conjugated beam.

As shown in FIG. 5, a laser 260 produces a beam of coherent electromagnetic radiation 262 which is directed into a beam expander 264. The beam expander increases the cross sectional area of beam 262 to form a beam 266 of parallel rays of electromagnetic radiation. Beam 266 is directed into a beam splitter 268 and is incident with a partially reflecting surface 270 thereof. The portion of beam 266 reflected by surface 270 forms a power beam 272 which is directed toward a convergence (or concave) mirror 274. Beam 272 is incident with mirror 274 so as to form a reflected converging beam 276 which has a larger area than beam 272 and has its rays of electromagnetic radiation converging. Beam 276 is directed into a nonlinear medium 278. Beam 276 passes through nonlinear medium 278 and is incident to a divergence (or convex) mirror 280. Mirror 280 reflects beam 276 to form a reflected diverging beam 282 which is collinear and coextensive with beam 276 into nonlinear medium 278. The relative curvatures of mirrors 274 and 280 and the distances between along with the angle of incidence of beam 272 is such that beams 276 and 282 are collinear and coextensive.

The portion of beam 266 not reflected by surface 270 of beam splitter 268 continues along its optical path to form imaging beam 284. Imaging beam 284 is incident to a mirror 286 and is reflected therefrom into nonlinear medium 278. The optical path of the beam 284 toward nonlinear medium 278 passes through mask 288. Mask 288 has a representation of the image which it is desired to reproduce onto an electromagnetic radiation sensitive surface 290. The phase conjugated beam 292, is converging as it propagates away from nonlinear medium 278. Phase conjugated beam 292 is generated by the pump wave within the nonlinear medium resulting from beams 276 and 282 and represents the phase conjugate of image beam 294 from mask 288 with a spatially amplitude modulated representation of the desired image thereon. Imaged beam 294 passes through beam splitter 296 and is incident to the nonlinear medium 278. The imaged beam 294 is incident to the pump wave in nonlinear medium 278 at a very small angle so as to allow maximum overlap of the pump and imaged beams.

The radius of curvature of mirrors and the distances between them are chosen appropriately to provide the desired reduction factor. Various optical components in various combinations can be utilized to replace the mirrors 274 and 280, for example, lens, conventional flat mirrors, etc. The power beam can be directed to a converging device initially and after passing through the nonlinear medium to a divering device. The beams from the converging device and the diverging device are coextensive within the nonlinear medium. The phase conjugated beam 292 from nonlinear medium 278 is reflected by surface 298 of beam splitter 296 at an angle of 90° to its incidence thereto and is directed toward surface 290 whereon the image is exposed into the electromagnetic radiation sensitive surface 290 for reproduction of the image on mask 288, but of a reduced size.

Figure 6:
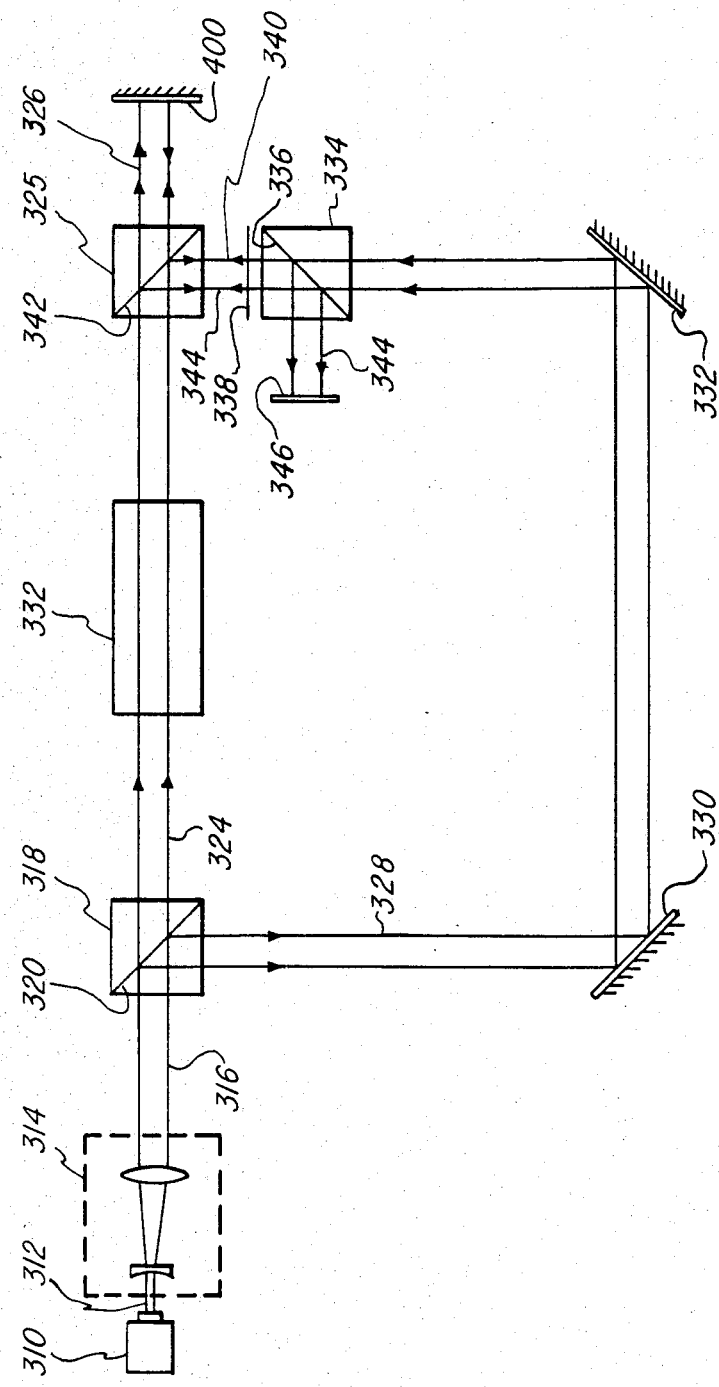
FIG. 6 is an optical apparatus which provides for the removal of diffraction and distortion effects which result when the imaging beam is passed through the mask by passing the phase conjugated beam through the the mask and thereby removing those defects therefrom.

As shown in FIG. 6, a laser 310 generates a beam of coherent electromagnetic radiation 312 which is directed into a beam expander 314. The beam expander produces a beam 316 which has a larger cross sectional area than beam 312. Beam 312 is directed at and is incident to a beam splitter 318. Most of the electromagnetic radiation within beam 316 passes through a partially reflecting surface 320 within beam splitter 318 and continues along its optical path and passes through a nonlinear medium 322. The electromagnetic radiation which passes through surface 320 forms a power beam 324 which passes through nonlinear medium 322 and a beam splitter 325 toward a mirror 326. Mirror 326 reflects beam 325, forming a reflected beam 326 which passes through beam splitter 325 and is collinear with beam 324 with nonlinear medium 322 to form the pump wave for four wave mixing, as discussed above.

The portion of beam 316, which is reflected by surface 320, forms an imaging beam 328 which is incident to mirrors 330 and 332 for directing beam 328 toward the beam splitter 325. Beam splitter 334, which is incident to beam 328 between mirror 332 and beam splitter 342, has a surface 336 which allows beam 328 to pass therethrough. Beam 328, after passing through beam splitter 334, is incident to a mask 338 which has a representation of the image which it is desired to reproduce thereon. The beam 328 is spatically amplitude modulated with a representation of the image to form an imaged beam 340 which is incident to a partially reflecting surface 342 within beam splitter 325. Imaged beam 340 is directed by surface 342 into the nonlinear medium 322 collinear with beams 324 and 326. The nonlinear medium 322 pumped by beams 324 and 326 and excited by beam 340 produces a phase conjugated beam 344 coincident with the portion of the optical paths of beams 324, 326, and 328, between the nonlinear medium 322 and beam splitter 325. The phase conjugated beam 344 is reflected by surfaces 342 and 336 and is directed thereby onto an electromagnetic radiation sensitive surface 346. Between beam splitters 325 and 334, beams 344 and 340 are coincident. Beam 344 passes through mask 338 which can correct certain defects caused by imperfections in the transparent material of mask 338 or by fine particulate matter on the surface thereof. After passing through mask 338, beam 344 enters beam splitter 334 and is reflected by surface 336 onto the surface 346. In this arrangement, the surfaces 320 and 342 must be polarized, as discussed above with reference to FIG. 4, in order to allow the electromagnetic radiation of the pump waves to pass, therethrough and to reflect the electromagnetic energy of the imaging beam 328 and imaged beam 340. The spatically amplitude modulated representation of the image on the mask 338 is not removed by passing the phase conjugated beam back through the mask, but only those defects a discussed above are corrected for.

The technique of passing the phase conjugated beam back through the mask can be incorporated into many different arrangements of optical components amd apparatus.

Having described the invention in connection with certain specific embodiments thereof, it is to be understood that further modifications may now suggest themselves to those skilled in the art and it is intended to cover such modifications as fall within the scope of the appended claims.

What is claimed is:

1. A system for producing a reduced image on a surface sensitive electromagnetic radiation comprising:
   (a) an emitting device producing a beam of coherent electromagnetic radiation;
   (b) a beam splitter incident to said beam separating said beam into a power beam and an imaging beam;
   (c) a mask incident to said imaging beam with said original image thereon to amplitude modulate said imaging beam to form an imaged beam;
   (d) a convergence device incident to said power beam to produce a converging power beam;
   (e) a divergence device incident to said converging power beam to produce a diverging power beam being collinear and coextensive with said converging power beam;
   (f) a nonlinear medium incident to said converging power beam, said diverging power beam, and said imaged beam to produce a phase conjugated beam; and
   (g) a target object having said surface disposed thereon incident to said phase conjugated beam producing a reduced image.

2. A method for producing a reduced image on a surface sensitive to electromagnetic radiation comprising the steps of:
   (a) directing a converging power beam of coherent electromagnetic energy of a certain frequency through a nonlinear medium;
   (b) directing a diverging power beam collinear and coextensive with said converging beam of said certain frequency into said nonlinear medium;
   (c) directing an image beam of coherent electromagnetic energy with an amplitude modulated representation of said image thereon into nonlinear medium to produce a converging phase conjugated imaged beam of coherent electromagnetic radiation with a representation of said image thereon; and
   (d) directing said phase conjugated imaged beam onto said surface producing a reduced image.

3. An optical apparatus for a phase conjugated imaging system having a source of coherent electromagnetic energy directed in a beam along a first optical path and a nonlinear medium comprising:
   (a) a beam splitter positioned along said first optical path to separate said beam into a power beam directed along said first optical path and an imaging beam directed along a second optical path;
   (b) a converging device incident to said power beam along said first optical path directing a converging power beam through said nonlinear medium along said first optical path;
   (c) a diverging device incident to said converging power beam directing a diverging power beam collinear and coextensive with said converging power beam along said first optical path into said nonlinear medium;
   (d) a mask with a representation of said image thereon incident to said imaging beam along said second optical path for producing an imaged beam having an amplitude modulated representation of said image thereon directed along said second optical path into said nonlinear medium; and
   (e) a beam splitter positioned along said second optical path intermediate said mask and said nonlinear medium for passing said image beams therethrough and directing along a third optical path a phase conjugated image beam from said nonlinear medium incident thereto received along said second optical path.

4. A system for producing a reduced image on a surface sensitive to electromagnetic radiation comprising:
   (a) an emitting device producing a beam of coherent electromagnetic radiation;
   (b) a beam splitter incident to said beam separating said beam into a power beam and an imaging beam;
   (c) a mask incident to said imaging beam with said original image thereon to amplitude modulate said imaging beam to form an imaged beam;
   (d) a diverging device incident to said power beam to produce a diverging power beam;
   (e) a converging device incident to said converging power beam to produce a converging power beam collinear and coextensive with said diverging power beam;
   (f) a nonlinear medium incident to said converging power beam, said diverging power beam, and said imaged beam to produce a phase conjugated beam; and
   (g) a target object having said surface disposed thereon incident to said phase conjugated beam producing a reduced image.

* * * * *